United States Patent

Bartuska

[11] Patent Number: 5,146,166
[45] Date of Patent: Sep. 8, 1992

[54] METHOD AND APPARATUS FOR ENHANCING SAMPLE ANALYSIS RATE IN MAGNETIC RESONANCE SPECTROSCOPY

[75] Inventor: Victor J. Bartuska, Fort Collins, Colo.

[73] Assignee: Chemagnetics, Inc., Fort Collins, Colo.

[21] Appl. No.: 563,410

[22] Filed: Aug. 6, 1990

[51] Int. Cl.$^5$ .............................................. G01R 33/20
[52] U.S. Cl. .................................................... 324/321
[58] Field of Search ............... 324/300, 307, 309, 308, 324/318, 322

[56] References Cited

U.S. PATENT DOCUMENTS

| | | | |
|---|---|---|---|
| 3,512,078 | 5/1970 | Hall | 324/0.5 |
| 3,796,946 | 3/1974 | Utsumi | 324/0.5 |
| 4,088,944 | 5/1978 | Engler | 324/0.5 |
| 4,091,323 | 5/1978 | Landis | 324/318 |
| 4,275,350 | 6/1981 | Hill | 324/321 |
| 4,422,151 | 12/1983 | Gilson | 364/496 |
| 4,581,583 | 4/1986 | Van Vliet | 324/321 |
| 4,859,948 | 8/1989 | Kuster | 324/318 |
| 4,859,949 | 8/1989 | McKenna | 324/321 |

FOREIGN PATENT DOCUMENTS 0197791 10/1986 European Pat. Off. ............... 24/2

OTHER PUBLICATIONS

Analogic Corporation (Bill Wittbold), "Analogic Announces NMR Spectroscopy Systems ", 1989.
General Electric Company, "Automated, Analytical, NMR Spectroscopy System", date unknown.

Primary Examiner—Michael J. Tokar
Attorney, Agent, or Firm—Jean M. Macheledt

[57] ABSTRACT

An automatic liquid sample changer for use with a magnetic resonance spectrometer and having separate upper and lower openings in a sample container guide tube to allow a sample container to pass into an analysis area from a superior positioned storage rack, and then subsequently from analysis area into an inferior positioned storage rack, and wherein gravity acts as the means for transporting a sample container through the system. Air bearing or other supports which do not frictionally engage sample container are used to delocalize spin wobble of sample container within sample container guide tube. The first, also acting as a spin drive is proximal to open end of sample container. The second is proximal to the closed end of sample container. A unitary means for sealing, rotor and vortex plug device enhances spectra, aids in reducing wobble and maintains a proper seal of sample container. Economical as well as reliability characteristics are realized as mechanical parts have been minimized and both ejection air and mechanical arms are eliminated.

25 Claims, 3 Drawing Sheets

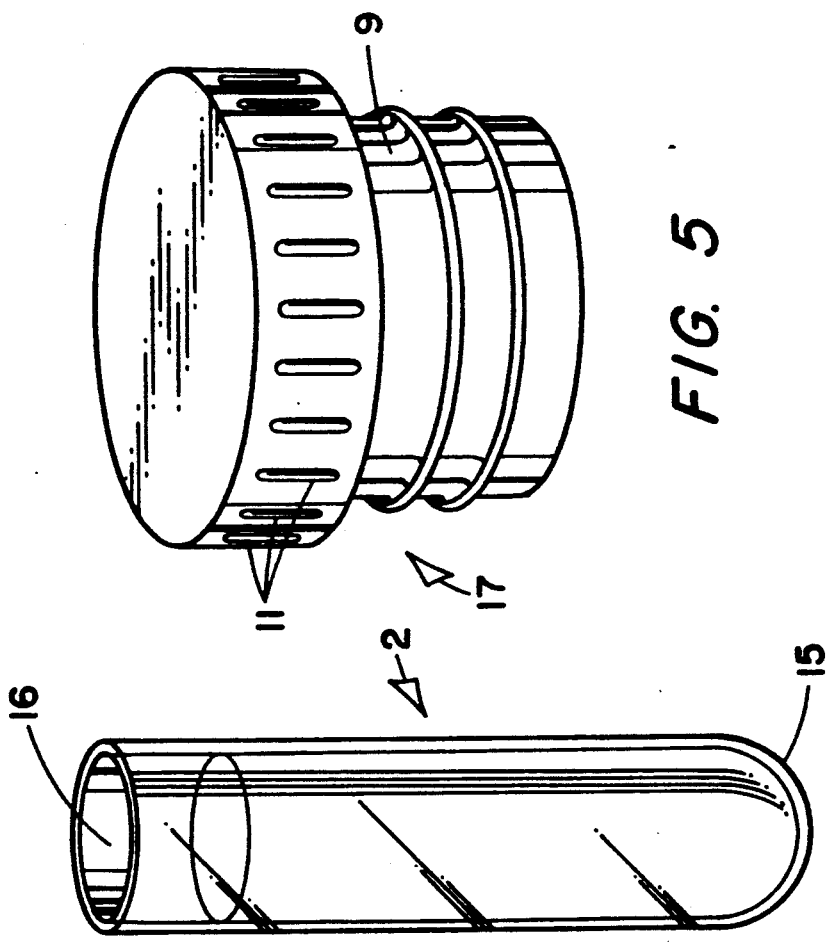
FIG. 5
FIG. 4
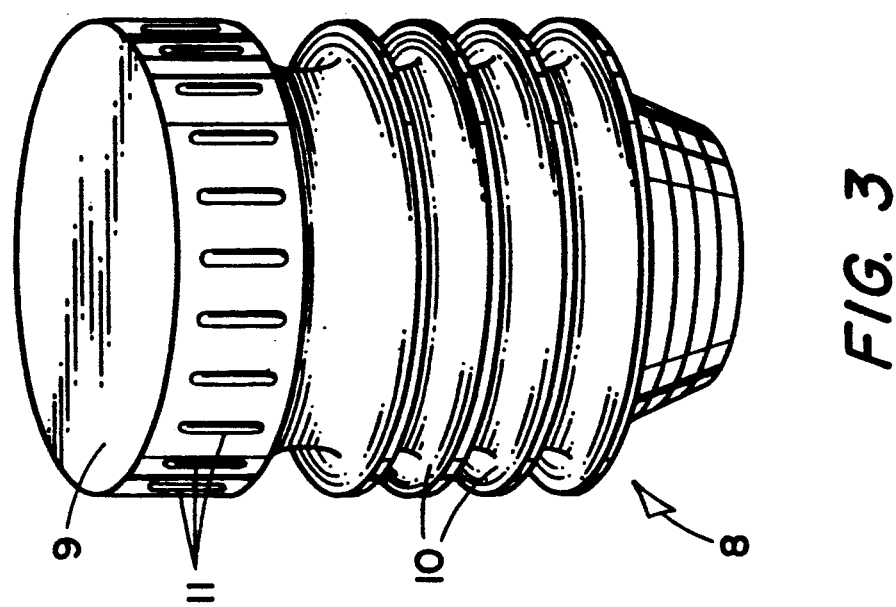
FIG. 3

METHOD AND APPARATUS FOR ENHANCING SAMPLE ANALYSIS RATE IN MAGNETIC RESONANCE SPECTROSCOPY

BACKGROUND OF THE INVENTION

The present invention relates to the field of magnetic resonance liquid sample changers. More specifically, the invention relates to the narrow field of automatic magnetic resonance liquid sample changers for use with a significant number of liquid samples to be consecutively analyzed.

Magnetic resonance spectroscopy is an aspect of analytical chemistry which includes Nuclear Magnetic Resonance (NMR) spectroscopy. This technique is used to determine the characteristics of a particular sample and to identify basic structures and compositions of that sample based on a resulting spectrum. In some industrial and educational applications it has often been desirable to prepare a large number of similar samples for NMR analysis. After preparation of these samples each needs to be entered individually into an analysis chamber, analyzed and removed from the chamber. The aforementioned procedure may be performed either manually, in which case the operator, loads and unloads the samples by hand, or automatically, using an apparatus such as the one shown in European Patent Number 0197791 A2 to Smallcombe and Codrington. The former method is obviously costly and time consuming for the operator while the latter, although not necessarily quicker, frees up the operator to tend to other matters. In some instances the automatic sample changing system may run completely independent after initial activation, allowing samples to be analyzed overnight or over the weekend at minimal cost. It would seem that these reasons have led those skilled in the art to view the field of automatic magnetic resonance sample changers differently than the field of manual magnetic resonance sample changers. That is, those skilled in the art have considered the field of automatic sample changers to be a progressive improvement over the manual sample changer field, and therefore they do not necessarily look back upon this field to progress further. Likewise, because of the differing spin velocities, and sample preparation requirements of liquids and solids these two fields of NMR are also very different.

The availability of automatic liquid sample changers in magnetic resonance spectroscopy has been known by those skilled in the art for some time. Independent automatic insertion, analysis and removal of liquid samples has led to a number of U.S. and foreign patents over the years. However, prior to the present invention some basic problems remained which negatively affected the overall system reliability as well as posed some special analyses difficulties for the spectroscopist. These problems included, but were not limited to, the use of an affirmative means, such as compressed gas, to eject samples from the magnetic field after analysis and the time consuming task of fitting each and every sample tube with its own, often bulky, spinner.

Difficulties encountered when using a compressed gas for ejection were sometimes related to the inaccuracies of gas pressure control, resulting in too little or too much pressure. Others skilled in the art have noted that under such conditions samples could either fail to reach an exitable point or they could eject in a rather unpredictable manner from their analysis positions. U.S. Pat. No. 4,859,948 to Kuster utilizes an adjustable control valve to regulate the quantity of compressed gas used in ejecting the sample containers. This approach typifies that taken by those skilled in the art as one to compensate for a limitation rather than one which attempts to overcome the reason for the limitation.

Another difficulty occurred when a spinner served a dual purpose—acting as the sole support for the sample as well as the spinning mechanism, as in U.S. Pat. No. 3,796,946 to Utsumi. Positioned usually in the middle ¾ of the sample tube, the spinner as a support offered little in the way of stabilization. Instead, the inherent wobble of a sample container would be accentuated at the distal ends of the container, with the greatest degree of wobble occurring at the heavier closed end located within the analysis area of the NMR spectrometer. This aspect has created the problem of undesirable spectral sidebands during the spinning of the sample in analysis. Because solid samples are spun at rates which are magnitudes greater than those of liquid samples, the problem of sample wobble in solid NMR was not analogous to the problem of sample wobble in liquid NMR. This is essentially one reason the two fields are so distinct from one another.

Another difficulty commonly accepted by those skilled in the art was the use of a single passage or opening for the insertion and removal of the samples. This significantly limited the speed with which samples could be changed because a sample would have to be removed completely before a subsequent sample could be inserted. In U.S. Pat. No. 4,581,583 to Van Vliet et al., the principal objective as stated was to increase the rate of changing samples. But even with this narrow focus Van Vliet failed to realize, among other things, the value of separate entrance and exit openings to enhance the potential speed with which samples could be analyzed.

An important commercial problem encountered in the prior art is one of an economic nature. That is, prior to the present invention other systems were so complex in design that their cost had been a significant deterrent to companies or other institutions which would have otherwise benefitted from such a system.

While at first glance some of these difficulties might seem easily resolved, it appears that in the general field of magnetic resonance spectroscopy a dichotomy exists between the theorists and the mechanical technicians. On the one hand, the theorists are devoted almost entirely to the advancement of their field through discovery based on theory-related principles. They spend little time on the mechanically-orientated aspects of magnetic resonance devices. On the other hand, the technicians, while often capable of designing mechanical accessories, were typically unaware of the specific problems that existed, making it difficult for them to either recognize the need for or to conceptualize the present invention.

The problems, as explained above, were dealt with in a number of ways by those skilled in the art. Some designs were put forth in which samples were inserted by a mechanical ram into a spinning air motor device located within the analysis area of the magnetic resonance spectrometer. This may have eliminated the use of individual spinners and ejection air but created other significant reliability problems. The use of mechanical parts to perform any function usually requires an increased amount of repair and replacement occurrences.

To maintain reliability of mechanical systems there has always been the likelihood of increased cost.

Others concentrated on the spectral sideband problem, attempting to stabilize the sample during spinning by using a heavy spinner or a larger spinner for increased surface contact. This approach required an increase in the velocity of the spin and ejection air to overcome the higher coefficient of friction and lifting requirements of a heavier sample. This technique is the one employed by Utsumi. Large stabilizing blades are supplied to steady the sample in rotation as they also frictionally engage the sample tube holder to act as a support.

In order to solve these and other problems encountered in the field of automatic magnetic resonance sample changers, the present invention was developed. By supplying not one, but two separate openings the samples may be inserted into one and removed from the other. Furthermore, by linking these separate openings vertically the sample may be carried into the analysis area by gravity, and more importantly the sample may also exit the analysis area by gravity. The present invention has fewer mechanical parts to wear out or maintain and the present invention needs no failure-prone compressed air to eject the sample. To overcome the problems caused by the use of individual spinners the present invention has been designed to utilize a component essential to liquid state NMR analysis—the sample container cap—to efficiently spin the sample.

While the basis of the present invention could be considered to be relatively simple, it is a fact that those skilled in the art of automatic magnetic resonance sample changers failed to realize the proper combination and selection of elements to overcome a combination of prior limitations. Although the implementing arts and elements of the present invention were available, those in the field focusing on the problems of a proper automatic sample changer had not been able to solve these problems. The preconception that a single opening was a given, resulted in those skilled in the art teaching away from the direction of the present invention. While there had been substantial attempts by those skilled in the art at overcoming the problem of undesirable spectral sidebands in magnetic resonance spectroscopy, until the present invention such attempts had not resulted in an adequate economical solution to the problem.

Finally, the seeming presence of a dichotomy in skill levels in the field of NMR spectroscopy made solutions even more difficult. One group possessed an appreciation of the aforementioned problems but not the ability to successfully design a solution. The other group, while possessing the mechanical skill, was lacking a perception of the particular problems stated above and an appreciation that changes could be made in most systems without impacting their scientific capabilities. Just such a communication "gap" had caused designers to retain many restrictions even after the reason for the restrictions had gone. For instance, restrictions imposed by the use of electro-magnets in NMR spectrometers need not have been imposed once superconducting magnets were utilized. In these systems mechanical and/or electrical components and assemblies were typically located beneath the analysis area, requiring samples to be removed through the top. Now with the longer super-conducting magnets, chambers can lend themselves to separate entrance and exit openings.

As an instructive guide to show the direction taken by some persons skilled in the art and the focus of their inventions, the following information is submitted. It is not an intent to imply that each should be necessarily considered relevant to the disclosed invention, rather only to demonstrate the problems encountered in the general field of magnetic resonance sample changers and how differently they were dealt with compared to the approach of the present invention.

U.S. Pat. No. 3,796,946 to Utsumi, et al., relates to a sample intake means for inserting and removing a sample from a magnetic resonance spectrometer. It operates by lifting the cover to raise the sample tube holder, and then closing the cover to lower the holder into the analysis area. This is all done manually rather than automatically.

U.S. Pat. No. 4,088,944 to Engler, et al., discloses a turbine for centering the sample tube in the same rotational axis. The tube is frictionally engaged at two locations proximal to its lower end, thereby reducing the wobble of the tube.

U.S. Pat. No. 4,091,323 to Landis is an automated sample changer for NMR Spectroscopy. A robotic arm is maneuvered up, down, back and forth by pneumatic means controlled by a gas fluidics circuit. Samples are subsequently inserted into and removed from an upper opening in the spectrometer guide tube.

U.S. Pat. No. 4,581,583 to Van Vliet and Gordon is an automatic sample selecting and positioning apparatus which utilizes individual spinners, as well as ejection air. Samples are inserted and ejected through the same opening in the top of the spectrometer and replaced to their original position in a sample carousel.

European Patent Number 0197791 A2 issued to Smallcombe and Codrington pertains to an automated apparatus for presentation of samples to an NMR spectrometer. However, the focus seems to be the use of coding labels, and an optical detection channel for identifying samples before, during and after analysis. Each sample is subjected to the mechanical handling of a robotic arm which serves to grab the sample, place it in the spectrometer, then remove the sample and put it back in the rack.

U.S. Pat. No. 4,859,948 to Kuster relates to manual sample changers for use with large magnet arrangements. The sample carrier is lowered into and ejected from the upper opening of the guide tube via pressurized gas. One of its key features is that it requires little space to operate.

U.S. Pat. No. 4,859,949 to McKenna discloses an automatic sample changer which frictionally engages the sample container at two locations during analysis. Sample containers are inserted and removed from a single opening in the spectrometer guide tube.

While each of the aforementioned patents represents a significant invention in their respective fields, those related to magnetic resonance automatic liquid sample changers have not utilized the combination of key aspects of the present invention to accomplish their individual goals.

SUMMARY OF THE INVENTION

Generally, the goals of the present invention are to provide both a method and device which allows for the automatic insertion, analysis and removal of a liquid sample in a magnetic resonance spectrometer.

It is broadly an object of the present invention to provide a design which serves to utilize gravity to deliver samples into the spectrometer analysis area from a storage rack, and then allows the samples to be removed from the spectrometer analysis area and placed into a separate storage rack utilizing gravity.

It is a further object of the present invention to provide a design which serves to delocalize the inherent wobble of the sample container to an area distant from the spectrometer analysis area. Still a further object of the present invention is to support the sample container at its closed end to delocalize the wobble from the spectrometer analysis area.

Another object of the present invention is to provide a design which utilizes a shorter sample container and a unitary cap/plug and rotor device to substantially eliminate the inherent wobble of the sample container during spinning, by allowing the sample container to be supported in proximity to its upper end by the injected spin gas. It is still a further object to support the sample container in proximity to both ends to substantially eliminate the spin wobble of the sample container.

Another object of the present invention is to provide a design which achieves an increased rate of sample analysis. It is therefore an object of the present design to allow the sample container to pass straight through the probe, rather than exiting the same direction from which it entered. It is therefore a further object of the present invention to provide a design with separate entrance and exit openings to facilitate automatic analysis with a multiplicity of samples. It is also an object of the present invention to allow the NMR samples to be pre-heated or pre-cooled to a required temperature before entering the analysis area of the spectrometer. This aspect allows for an increased rate of sample analysis as well.

It is a further object of the present invention to increase overall system reliability. It is therefore a further object of the present invention to minimize the number of mechanical parts. It is also an object therefore to more efficiently utilize the effect of the earth's gravitational field to transport the sample containers from a first rack to the analysis area, and then further into a second rack after analysis.

Still another object of the present invention is to design an inexpensive, reliable automatic liquid sample changer for use with a magnetic resonance spectrometer. It is therefore an object of the present invention to minimize the mechanical parts utilized in the operation of multiple sample analysis.

Naturally, further objects of the present invention are disclosed throughout other areas of the specification and claims.

BRIEF DESCRIPTION OF THE DRAWINGS

FIG. 3 is a perspective view of the unitary cap/plug device.

FIG. 4 is a perspective view of a shortened sample container.

FIG. 5 is a perspective view of the sealing device.

DESCRIPTION OF THE PREFERRED EMBODIMENT

Figure 1:
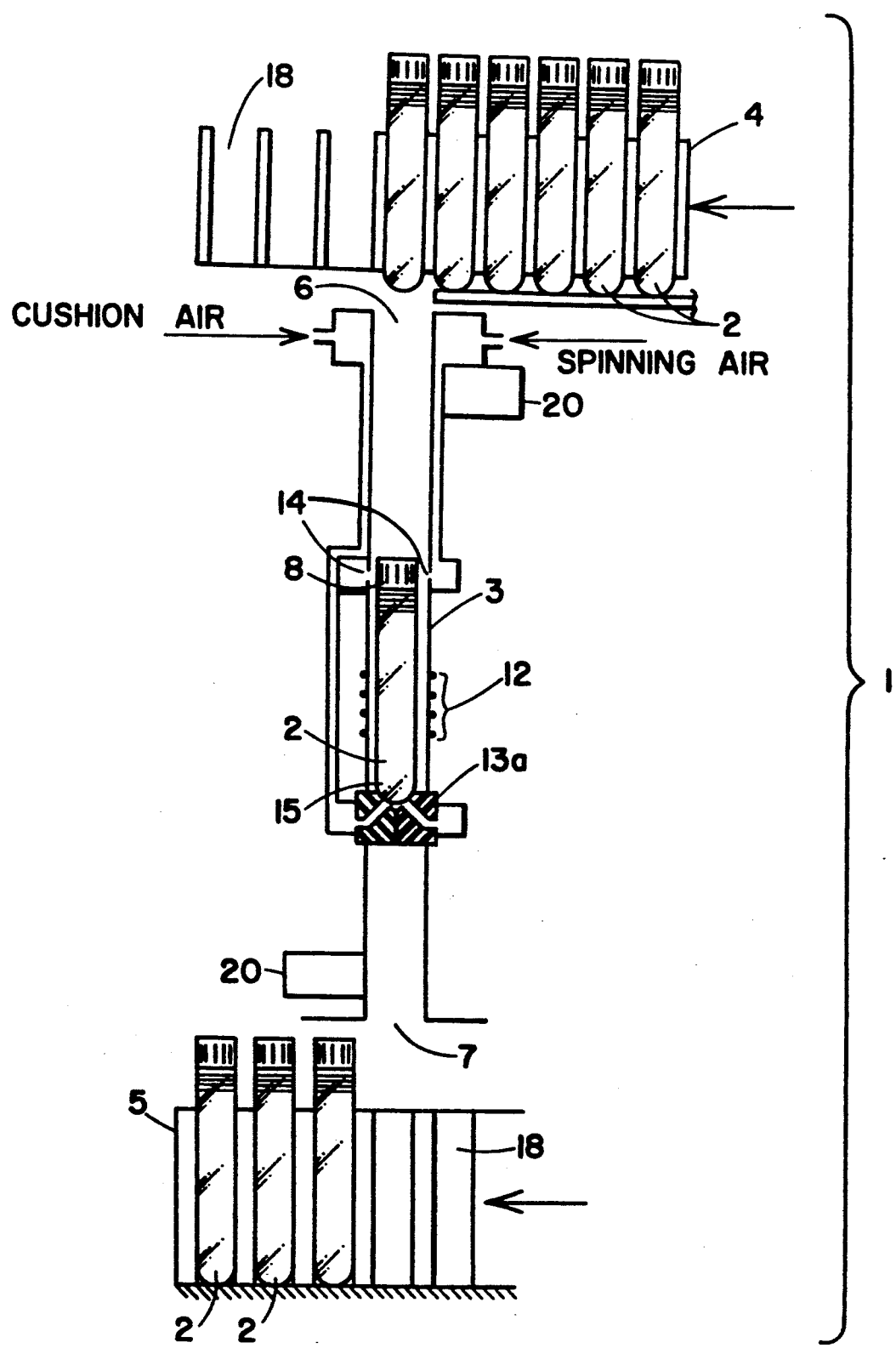
FIG. 1 is a cross-sectional view of one embodiment showing one sample container seated upon the support and ready to be spun. The arrows show the direction of movement of the two racks.

As can be seen from the drawings, the basic concept of the present invention involves several different aspects. Referring first to FIG. 1, first storage rack (4) holds a plurality of sample containers (2) in an analysis ready condition. First storage rack (4) is designed with a plurality of individual compartments (18) and may hold a large number of sample containers (2) depending on the quantity of samples to be analyzed and the space available. In operation, sample container (2) is fed into upper opening (6) in sample container guide tube (henceforth, guide tube) (3), falls, as a result of gravity, and comes to rest on support (13a), shown in its closed position. At this point, a substantial portion of sample container (2) is surrounded by analysis area (12) of the spectrometer, and is ready to be spun for analysis.

A spin gas is injected through spin air injectors (14) located, in this embodiment, above analysis area (12). The sample is then analyzed by any of the methods known to those skilled in the art. After analysis, support (13b) is retracted to the open position, shown more clearly in FIG. 2. Sample container (2) drops, again as a result of gravity, through lower opening (7) to rest in second storage rack (5) where it may be retained indefinitely. This process is, of course, repeated for each of the samples to be analyzed.

The detailed structure and operation of this embodiment of automatic sample changer (1) can be more completely understood when explained in three separate stages. The first of these stages is the pre-analysis stage, which deals with most aspects of the present invention realized or occurring before magnetic resonance analysis. For the second and third stages, the analysis stage and the post-analysis stage, respectively, a detailed discussion is also provided.

In the pre-analysis stage each material to be analyzed is prepared in a suitable manner commonly known to any person skilled in the art of NMR spectroscopy. Referring to FIG. 4, the prepared sample is contained within a number of sample containers (2) needed to efficiently perform the analysis. Each sample container (2) should be sealed, preferably with unitary cap/plug device (8) shown in FIG. 3 or sealing device (17) shown in FIG. 5, to prevent contamination of the sample or spillage. Another aspect of unitary cap/plug device (8) or sealing device (17) which will become more apparent later, is that they allow sample containers (2) to be spun by the injected spin air from spinning air injectors (14) as shown in FIG. 1. Sample containers (2) are then positioned within each individual compartment (18) of first storage rack (4), as shown in FIG. 1. A means for progressively moving first storage rack (4) is used to move first storage rack (4) laterally across upper opening (6), for reasons which will be understood later. The means for progressively moving is preferably, in this embodiment, a pneumatic system, but may be electrical or mechanical if desired. By the term "progressively" it is meant that first storage rack (4) is actuated in a direction which positions the next desired compartment (18) above upper opening (6). The prior art reveals a number of distinct styles for storage racks ranging from double-row concentric carousals to smaller straight-line cartridges.

With reference to FIG. 1, a single sample container (2) is positioned upon support (13a). Support (13a) is preferably made from a material with a low coefficient of friction, such as TEFLON, and/or support (13a) can be supplied with a low velocity bearing air to levitate sample container (2) slightly above support (13a). This is merely a passive support means and should be understood to differ from those of the prior art which frictionally engage the sample container by a more affirmative means. The means for delivering sample container (2) from storage rack (4) to support (13a) is accomplished as follows. Storage rack (4) is slidably mounted to move laterally across upper opening (6) in a fashion such as to align compartment (18) with upper opening (6) and allow sample container (2) to drop through upper opening (6) in guide tube (3) until it rests upon support (13a). Certainly there are a number of ways to laterally move storage rack (4) such as mechanically, electronically, pneumatically or even manually. It is important to note that although sample container (2) is light-weight and durable enough to withstand the short fall, cushion air or other means may be provided, if necessary, as a precautionary measure. Guide Tube (3) plays a limited role in each of the three stages and is a well-known component of magnetic resource spectroscopy. Unique aspects of guide tube (3) will be explained in the post analysis stage.

Figure 2:
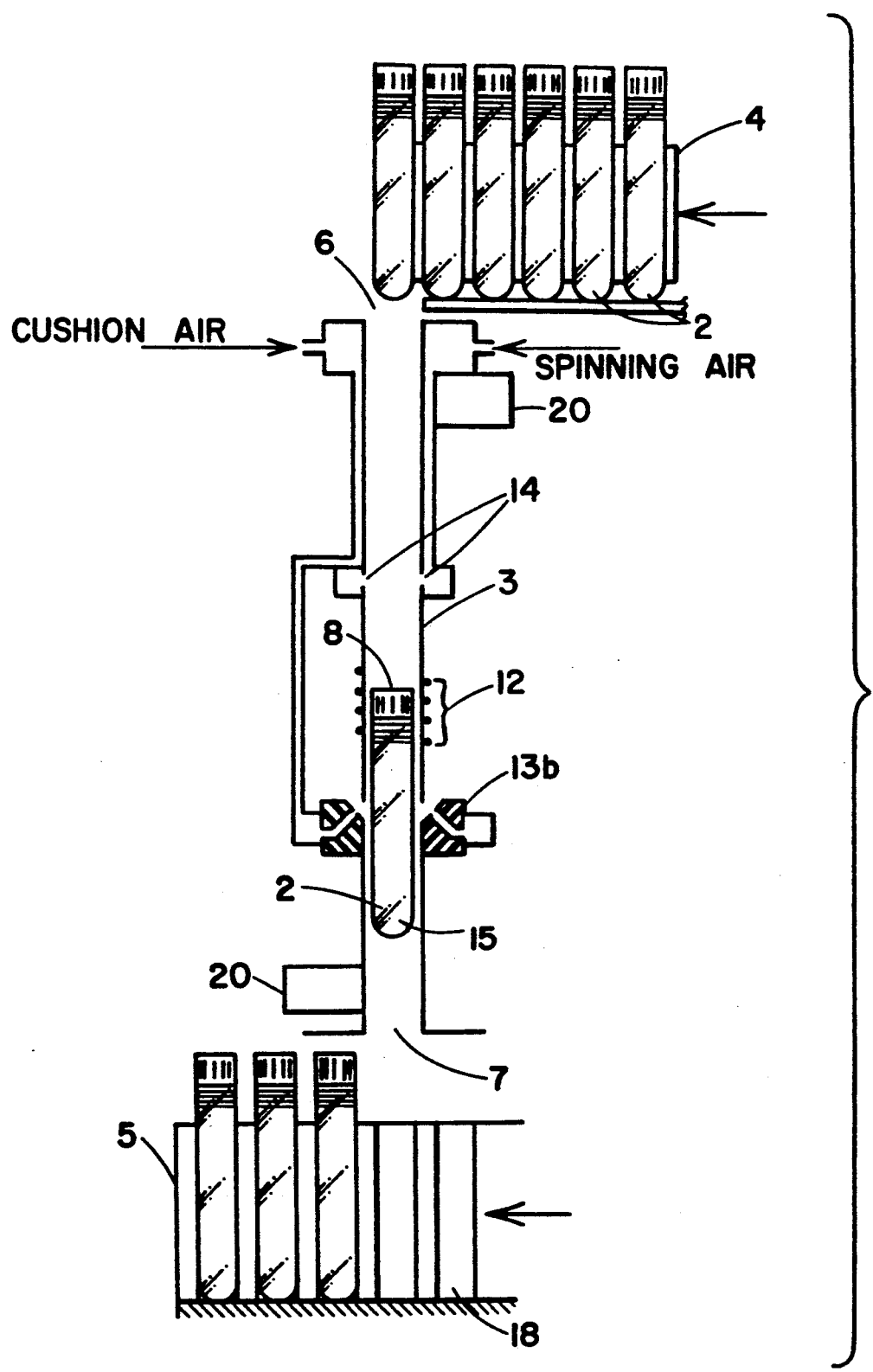
FIG. 2 is a cross-sectional view of the same embodiment shown in FIG. 1, except the sample container is shown partially exited from the analysis area.

Now the sample is ready for the analysis stage, and the enhanced analysis characteristics of the present invention may be understood with reference to FIGS. 1 and 2. As stated earlier, a portion of sample container (2) proximal to closed end (15) is shown to be enclosed by analysis area (12). In the present embodiment, closed end (15) of sample container (2) is in direct contact with support (13a)—necessitating the use of a near frictionless surface and/or bearing air. Supporting sample container (2) in this fashion aids in delocalizing the inherent wobble of sample container (2) from analysis area (12). That is, the wobble is significantly decreased at closed end (15). To further increase the stability of sample container (2) a small notch is shown in support (13a). Sample container (2) is positioned into this notch to reduce any wobble at closed end (15). Others have tried to lower certain tolerances to decrease this wobble, but focusing the wobble to an area outside of analysis area (12) has not, until the present invention, been entirely successful. Although, as will be understood later, the present invention also provides for the substantial elimination of wobble in other applications. Still referring to FIGS. 1 and 2, unitary cap/plug device (8) is positioned between a plurality of spinning air injectors (14). A plurality of scalloped "notches" are located on the exterior circumference of rotor portion (11) of unitary cap/plug device (8) and sealing device (17). A supply of air (not shown) may be a gas of any suitable nature, stored in a safe and convenient manner, and delivered to injectors (14) by any of the means previously known to those skilled in the art. Injected air proceeds to communicate with the scalloped "notches" of rotor portion (11) of unitary cap/plug device (8), as shown in FIG. 3, which results in the rotation of sample container (2). As will be understood later, unitary device (8) may also have vortex portion (10) to assist in improving the NMR spectra.

A key aspect of the present invention which helps to significantly eliminate the overall wobble of sample container (2) is the location of spinning air injectors (14). Sample container (2) is designed shorter than the conventional container and therefore remains entirely below spinning air injectors (14) when seated upon support (13a), while unitary cap/plug device (8) enters the path of the injected stream of spin air. This allows the injected spin gas to serve as a stabilizing means at an area slightly above the top of sample container (2), placing sample container (2) entirely between two stabilizing means during spinning and analysis. When used in conjunction with support (13a) wobble is significantly eliminated during spinning. This method of stabilizing support is also a passive support which is distinguishable from the more affirmative supports of the prior art which frictionally engage the sample container. Multiple supports inherently add stability, while positioning the supports at opposite ends of sample container (2) further enhances this stability.

Referring now to FIG. 2, the post-analysis stage is shown with support (13a in FIG. 1) now in an open position shown at (13b). The opening of support (13a) to the open position shown at (13b) is preferably accomplished by a pneumatic system, but may utilize electrical circuitry or a mechanical means if desirable. Sample container (2) is acted upon by gravity and falls through lower opening (7) of guide tube (3) and into second storage rack (5). At the time of release of sample container (2) from support (13b) the next-in-line sample container (2) resting in storage rack (4) may be inserted for analysis. The diameter of unitary cap/plug device (8) is essentially equal to or less than the outer diameter of sample container (2). This allows device (8) and container (2) to pass straight through guide tube (3), utilizing gravity, without making special allowances in the diameter of guide tube (3). The utilization of gravity in this application is believed to be completely unique to this field. That is, the means for removing sample container (2) out of analysis area (12) after retraction of support (13b) includes the effects of gravity. Other sample handling techniques include lifting or mechanically removing samples from their analysis positions. Other elements may assist in the removal of sample container (2), such as guide tube (3) which serves merely to maintain sample container (2) in a vertical position and the supply of cushioning air, if utilized, which is merely to slow the decent of sample container (2) before reaching second storage rack (5). An important note is that without either of these enhancements, sample container (2) would likely descend the short distance to storage rack (5) in much the same fashion.

Second storage rack (5) may be similar in design to first storage rack (4) in that it is slidably mounted with its own means for progressively moving and should be capable of holding at least the same number of sample containers (2). An essential difference is that storage rack (5) is obviously mounted below lower opening (7) of guide tube (3) and is moved in a fashion such that each exiting sample container (2) enters a vacant chamber in storage rack (5). Second storage rack (5) may also require design features different from the features of first storage rack (4) in order to accommodate different space requirements. Furthermore, because sample container (2) is free falling from support (13b) it may be desirable to equip second storage rack (5) with a cushioning means, such as foam rubber or the like, along its bottom surface.

As alluded to earlier, guide tube (3) has a characteristic unique to the present invention. That is, sample container (2) enters at one end of guide tube (3), namely upper opening (6), and exits through lower opening (7), which should be located in proximity, if not at, the opposite end of guide tube (3). This allows gravity to play a large role in the transportation of sample container (2).

Several distinguishable needs drove the development of the present invention. The first was the perceived need for enhanced reliability in an automatic liquid sample changer. This need was recognized and even addressed in other patents. None of these patents solved the need in the fundamental manner of the present invention. One of the major factors which sets the field of the present invention apart from fields in which samples are manually handled is the requirement of unattended operation. This naturally made reliability of the spectrometer system a necessity. However, with other automatic sample changers the duty of handling was merely passed on to robotic arms, push-rods and the like. This is in sharp contrast to the present invention which minimizes all types of handling, especially such mechanical handling, to enhance reliability. Once sample container (2) is placed into first storage rack (4) after preparation there should be no substantial need again for the container to be gripped, pushed, held or otherwise directed by hand. In addition to enhancing operational reliability the present invention helps to prolong the life of each sample container (2) by minimizing scratches, cracks or breaks which might otherwise occur.

Another novel aspect of reliability is the inherent safety mechanism of the present invention. In the event that a sample becomes jammed or there is some type of malfunction to the system, there is no mechanical arm or rod to exacerbate the problem by packing more samples into the system. By minimizing the number of mechanical pars needed to change samples in a spectrometer, the sample handling apparatus of the present invention will likely have causes less "wear and tear" from use which, in turn, will require less maintenance and provide a high standard of reliability over the entire life of the spectrometer system.

A second aspect addressed by the present design is that of greater economy. Prior automatic sample changers have become prohibitively expensive for many applications. As mentioned, the present invention avoids complex mechanisms; this, in turn, reduces the cost to fabricate. In addition, designed into the system is unitary cap/plug device (8) which does not require the expensive machining aspects of rotors with relatively high tolerances. Other design features mentioned earlier such as the minimal handling and safety mechanism help keep system maintenance and replacement costs to a minimum.

A principal need addressed by the design of the present invention is that of enhancing the processing speed of the system. That is, certain aspects of the present invention enhance the rate at which samples may be put through a magnetic resonance spectrometer. There is minimal handling of sample containers (2), so samples arrive quickly to analysis area (12). There is also the straight through concept which allows sample container (2) to enter and exit at separate openings. This feature enables consecutive sample containers (2) to be exiting and entering at substantially the same time, as long as support (13a) is in a closed position (as shown in FIG. 1) before entering-sample reaches the support (13a). This is unlike the sample changers of the prior art which require the complete removal of one sample container before the subsequent insertion of the next. In addition, an optical sensing means (20) positioned in proximity to both upper opening (6) and lower opening (7) the near simultaneous insertion and removal of subsequent sample containers (2) may be closely monitored to further enhance reliability. Optical sensing means (20) may be any of the various devices or methods practically used for such an operation.

The introduction of a thermostatting device (not shown) into first storage rack (4) may further enhance the speed of analysis. Typically, samples are inserted by an automatic sample changer and a certain amount of time is required for the sample to reach a required analysis temperature. In this embodiment each sample is brought to the proper analysis temperature while positioned in first storage rack (4) by the thermostatting device. The sample temperature may be raised or lowered as required. This allows an almost immediate analysis of the sample when it reaches analysis area (12). For some applications a thermostatting device may also be used in second storage rack (5) to keep the samples at an optimal temperature until a later time when they can be properly stored. The thermostatting device may be any of the means known by those skilled in the art for controlling the temperature of samples.

Another key need relates to enhancing the quality of the spectra obtained. As mentioned there are aspects of the present invention which help to eliminate wobble of sample container (2) within guide tube (3). This, or course, produces better resolution of the sample thereby reducing undesirable sidebands in the NMR spectra. Aspects of the present invention which address this goal include the use of shortened sample container (2), multiple supports at opposite ends of shortened sample container (2), and support (13a), as mentioned earlier, in conjunction with the passively supporting spin air. Also, the use of unitary cap/plug device (8) with vortex plug section (10) aids in eliminating the liquid vortexing which further impedes NMR spectra. A common, well-known problem in liquid NMR is the distortion apparent on some spectra due to the vortexing of the liquid sample—caused by the rapid spinning of sample—enclosed by the analysis area. The use of a vortex plug to prevent this occurrence is well known by those skilled in the art. However, with the shortened stature of sample container (2) in this embodiment a plug which is integral to the sealing device is preferable. The integral elements of unitary cap/plug device (8) make it no longer necessary for three separate devices to be used to spin sample, seal sample and avoid liquid vortexing. Instead, a single device—with consolidated elements—is added which performs all these functions as well as saves time in the process. With the conventional long NMR tube and the dual purpose of the spinner—to spin and support—a unitary device for sealing and spinning was seemingly never a focus for other skilled designers.

The foregoing discussion and the claims which follow describe the preferred embodiment of the present invention. Particularly with respect to the claims, it should be understood that changes may be made to the invention without departing from its essence. In this regard it is intended that such changes will still fall within the scope of the present invention. It simply is not practical to describe and claim all possible revisions to the present invention which may be accomplished. To the extent such revisions utilize the essence of the present invention, each would naturally fall within the breadth of protection encompassed by this patent.

I claim:

1. An apparatus for automatically handling multiple samples in a magnetic resonance spectrometer comprising:
   a. a plurality of sample containers capable of retaining a material to be tested, said containers having an open end and a closed end;
   b. a sample container guide tube which creates a pathway for said sample containers, and having a length, upper and lower openings, and further having a magnetic field area;

c. a first storage means capable of retaining said sample containers situated in the vicinity of said upper opening of said guide tube;
d. a means for progressively moving said first storage means;
e. a means for sequentially inserting each of said sample containers into said magnetic field area;
f. a means for supporting a portion of said sample container in said magnetic field area during magnetic resonance analysis;
g. a means for spinning one of said sample containers to perform magnetic resonance analysis;
h. a means for removing each of said sequentially inserted sample containers from said magnetic field area;
i. a second storage means capable of retaining said sample containers situated in the vicinity of said lower opening of said sample container guide tube;
j. a means for progressively moving said second storage means.

2. An apparatus for automatically handling multiple samples in a magnetic resonance spectrometer as described in claim 1 and further comprising a means for controlling the temperature of each sample to be analyzed.

3. An apparatus for automatically handling multiple samples in a magnetic resonance spectrometer as described in claim 1 wherein said means for removing each of said sample containers comprises gravity.

4. An apparatus for automatically handling multiple samples in a magnetic resonance spectrometer as described in claim 1 wherein said means for sequentially inserting each of said sample containers comprises gravity and wherein said means for removing each of said sample containers comprises gravity.

5. An apparatus for automatically handling multiple samples in a magnetic resonance spectrometer as described in claim 2 wherein said means for removing each of said sample containers comprises gravity.

6. An apparatus for automatically handling multiple samples in a magnetic resonance spectrometer as described in claim 2 wherein said means for sequentially inserting each of said sample containers comprises gravity and wherein said means for removing each of said sample containers comprises gravity.

7. An apparatus for automatically handling multiple samples in a magnetic resonance spectrometer as described in claims 1, 3 or 4 and further comprising a means for delocalizing spin wobble of said sample container during analysis.

8. An apparatus for automatically handling multiple samples in a magnetic resonance spectrometer as described in claim 7 wherein said means for delocalizing spin wobble comprises said means for supporting.

9. An apparatus for automatically handling multiple samples in a magnetic resonance spectrometer as described in claim 8 wherein said means for supporting is located in proximity to said closed end.

10. An apparatus for automatically handling multiple samples in a magnetic resonance spectrometer as described in claim 7 and further comprising a means for preventing spectral distortions.

11. An apparatus for automatically handling multiple samples in a magnetic resonance spectrometer as described in claim 10 and further comprising a means for sealing said open end of said container wherein said means for preventing spectral distortions and said means for sealing are unitary.

12. An apparatus for automatically handling multiple samples in a magnetic resonance spectrometer as described in claim 11 wherein said means for spinning comprises a rotor and wherein said means for sealing and said rotor are unitary.

13. An apparatus for automatically handling multiple samples in a magnetic resonance spectrometer as described in claim 12 wherein said means for preventing spectral distortions comprises a vortex plug.

14. An apparatus for automatically handling multiple samples in a magnetic resonance spectrometer as described in claim 11 wherein said sample container and said unitary means for sealing have a maximum diameter and wherein said diameter of said unitary device is approximately equal to said diameter of said sample container.

15. An apparatus for automatically handling multiple samples in a magnetic resonance spectrometer as described in claim 7 and further comprising a safety mechanism means wherein said means comprises gravity.

16. An apparatus handling samples in a magnetic resonance spectrometer comprising:
a. at least one sample container for retaining a material to be tested, said container having an open end and a closed end;
b. a sample container guide tube having an upper opening, a lower opening, and a magnetic field area and which creates a pathway for said sample container;
c. a first means for supporting said sample container in proximity to said closed end; and
d. a second means for supporting said sample container in proximity to said open end comprising a stream of fluid injected into said guide tube.

17. An apparatus for handling samples in a magnetic resonance spectrometer as descried in claims 1 or 16 and further comprising a cap for sealing said open end comprising a rotor.

18. An apparatus for automatically handling multiple samples in a magnetic resonance spectrometer as described in claim 16 further comprising a means for inserting said sample container into said upper opening and a means for removing said sample container from said lower opening.

19. An apparatus for automatically handling multiple samples in a magnetic resonance spectrometer as described in claim 18 wherein said means for removing comprises dropping said sample container out of said guide tube through said lower opening.

20. A method for automatically handling multiple samples in a magnetic resonance spectrometer having a sample container guide tube having a length and upper and lower openings, said method comprising the steps of:
a. inserting one of said samples into said upper opening of said guide tube; then
b. stopping said sample part-way along said length of said guide tube; then
c. supporting said sample with a supporting means while analyzing said sample; and
d. removing said sample from said sample guide tube through said lower opening.

21. A method for automatically handling multiple samples in a magnetic resonance spectrometer as described in claim 20 wherein said step of analyzing comprises the steps of spinning said sample, stabilizing said sample in the vicinity of both an open and closed end of said sample, and evaluating said sample.

22. A method for automatically handling multiple samples in a magnetic resonance spectrometer comprising the steps of:
   a. inserting one of said samples into said spectrometer; then
   b. stopping said sample in said spectrometer; then
   c. supporting said sample;
   d. spinning said sample;
   e. stabilizing said sample in the vicinity of both an open and closed end of said sample; and
   f. removing said sample from said spectrometer by the operation of gravity.

23. A method for automatically handling multiple samples in a magnetic resonance spectrometer as described in claim 20 wherein said step of removing said sample comprises the step of dropping said sample through the remaining length of said guide tube.

24. A method for automatically handling multiple samples in a magnetic resonance spectrometer as described in claim 20 wherein said step of supporting said sample comprises providing a support capable of stabilizing said sample.

25. A method for automatically handling multiple samples in a magnetic resonance spectrometer as described in claims 20 or 22 further comprising the step of heating said sample before said step of inserting one of said samples.

* * * * *